United States Patent
Thrivikraman et al.

(10) Patent No.: US 8,212,291 B2
(45) Date of Patent: Jul. 3, 2012

(54) INVERSE MODE SIGE HBT CASCODE DEVICE AND FABRICATION METHOD

(75) Inventors: Tushar K. Thrivikraman, Decatur, GA (US); Aravind Appaswamy, Atlanta, GA (US); John D. Cressler, Smyrna, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 12/381,345

(22) Filed: Mar. 11, 2009

(65) Prior Publication Data

US 2009/0231034 A1 Sep. 17, 2009

Related U.S. Application Data

(60) Provisional application No. 61/035,903, filed on Mar. 12, 2008.

(51) Int. Cl.
*H01L 29/737* (2006.01)
(52) U.S. Cl. ........ 257/197; 257/370; 257/574; 257/575; 257/566; 257/560; 257/563; 330/311
(58) Field of Classification Search .......... 330/311; 257/197, 370, 574, 575, 566–569, E27.053, 257/E29.054, E29.055, 560, 563, E29.034
See application file for complete search history.

(56) References Cited

U.S. PATENT DOCUMENTS

| | | | |
|---|---|---|---|
| 4,257,059 A | 3/1981 | Herndon | |
| 5,066,926 A | 11/1991 | Ramachandran et al. | |
| 5,084,750 A | 1/1992 | Adlerstein | |
| 5,177,584 A | 1/1993 | Uchida et al. | |
| 5,317,208 A | 5/1994 | Banker et al. | |
| 5,399,899 A | 3/1995 | Dekker et al. | |
| 6,414,545 B1 * | 7/2002 | Zhang | 330/149 |
| 6,593,628 B2 | 7/2003 | Dekker et al. | |
| 7,576,409 B1 * | 8/2009 | Chen et al. | 257/560 |
| 2006/0017065 A1 * | 1/2006 | Kobayashi | 257/197 |
| 2006/0033183 A1 | 2/2006 | Bromberger | |
| 2006/0199348 A1 | 9/2006 | Bromberger | |

FOREIGN PATENT DOCUMENTS

JP 63081972 4/1988

OTHER PUBLICATIONS

G. Niu et al., IEEE Trans. Nucl. Sci., vol. 49, No. 6, pp. 3107-3114, Dec. 2002.
R. Krithivasan et al., IEEE Trans. Nucl. Sci., vol. 50, No. 6, pp. 2126-2134, Dec. 2003.
R. Krithivasan et al., IEEE Trans. Nucl. Sci., vol. 52, No. 6, pp. 3400-3407, Dec. 2006.

* cited by examiner

Primary Examiner — Michael Shingleton
(74) Attorney, Agent, or Firm — Dustin B. Weeks, Esq.; Ryan A. Schneider, Esq.; Troutman Sanders LLP

(57) ABSTRACT

Disclosed is a device structure using an inverse-mode cascoded Silicon-Germanium (SiGe) Heterojunction Bipolar Transistor (HBT) beneficial in applications requiring radiation hardened circuitry. The device comprises a forward-mode common-emitter HBT cascoded with a common-base inverse-mode HBT, sharing a common sub-collector. An exemplary device was measured to have over 20 dB of current gain, and over 30 dB of power gain at 10 GHz, thus demonstrating the use of these circuits for high-frequency circuit applications. In addition, the radiation response and voltage limits were characterized and showed to have negligible performance effects in typical operating conditions. Due to the unique topology, the disclosed device has the benefit of being a more compact cascode design and the additional benefit of providing significantly improved radiation tolerance.

19 Claims, 6 Drawing Sheets

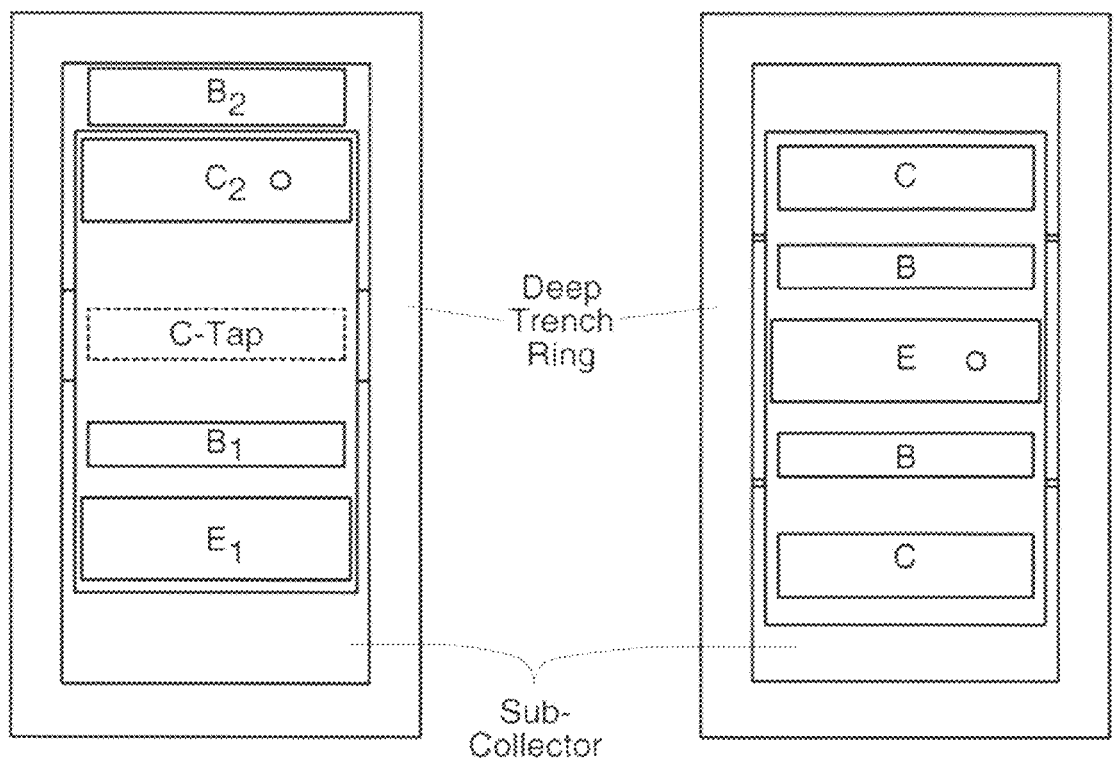
FIG. 3a
FIG. 3b (Prior Art)
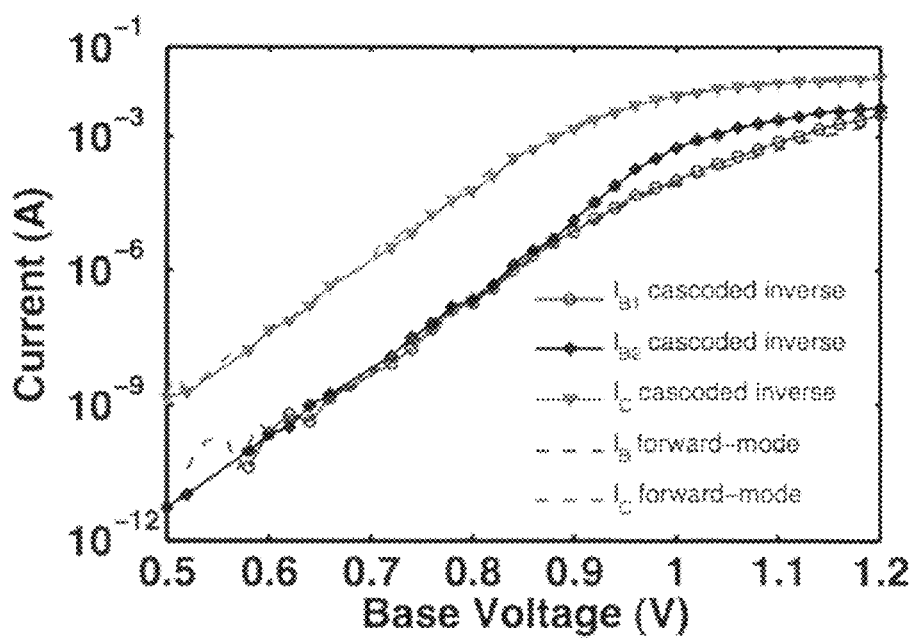
FIG. 4

INVERSE MODE SIGE HBT CASCODE DEVICE AND FABRICATION METHOD

This application claims the benefit of U.S. Provisional Application No. 61/035,903, filed Mar. 12, 2008.

FIELD OF THE INVENTION

The present invention relates generally to the field of semiconductor heterojunction bipolar transistors, and more particularly to a device structure and fabrication method using an inverse-mode cascoded SiGe HBT in which single-event-upset (SEU) hardening may be substantially improved.

BACKGROUND OF THE INVENTION

Space remains a classic extreme environment encompassing large radiation fields in addition to wide temperature swings; these environmental factors place stringent demands on technology platforms for use in space-based electronic systems.

Ionizing radiation can cause unwanted effects in semiconductor devices. These unwanted changes of state caused by ions or electromagnetic radiation striking a sensitive node in a micro-electronic device are known as single event upsets (SEUs). SEU mitigation is a major concern and an area of active research for this technology as a result of upset sensitivities to ion linear energy transfers as low as 1 MeV-cm$^2$/mg for unhardened applications.

Current technology employs process modifications to radiation harden microelectronics. However, these technologies are typically expensive and lag in performance with commercial processes, and therefore, there is a need for developing radiation-hardening by design (RHBD) techniques. These techniques center on using circuit and layout optimizations to improve the circuit radiation response. This is discussed by G. Niu et al., IEEE Trans. Nucl. Sci., vol. 49, no. 6, pp 3107-3114, December 2002, R. Krithivasan et al., IEEE Trans. Nucl. Sci., vol. 50, no. 6, pp. 2126-2134, December 2003, and R. Krithivasan et al., IEEE Trans. Nucl. Sci., vol. 52, no. 6, pp. 3400-3407, December 2006.

A good candidate technology for these RHBD techniques is Silicon-Germanium Hetero-junction Bipolar Transistors (SiGe HBTs) due to their natural fit for extreme environment applications. SiGe HBTs are understood to be total-dose radiation tolerant due to: (1) the heavily doped, epitaxially grown, extrinsic base, (2) thin emitter-base (EB) spacer, and (3) compact and heavily doped active regions.

Microelectronic device and circuit designers have long sought to combine the superior transport properties and design flexibility offered by bandgap engineering using SiGe with the high yield and low cost of conventional Si fabrication. However, because of the difficulty in growing lattice-matched SiGe alloy on Si, this concept has only reached a sufficiently practical state over the last decade. With the introduction of epitaxial SiGe alloys, this capability has finally been achieved.

Notwithstanding SiGe HBT applicability to extreme environment applications, SiGe HBTs are not immune to SEUs and are vulnerable to upsets even at low linear energy transfer rates. Therefore, there is a need in the industry for RHBD SiGe HBT circuitry capable of improved SEU immunity.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 3a is a top-down representation of one embodiment of an inverse-mode cascode device.

FIG. 3b is a top-down representation of one embodiment of an unhardened SiGe HBT device.

FIG. 4 is a plot of base and collector current versus base voltage.

DETAILED DESCRIPTION

Briefly described, the present technology includes, in a preferred exemplary embodiment, a novel RHBD cascode topology comprising a forward-mode SiGe HBT sharing a sub-collector with an inverse-mode SiGe HBT. An electrical connection to the sub-collector may be present to provide additional SEU immunity. This topology can result in a device with smaller footprint and improved radiation hardening.

Figure 1:
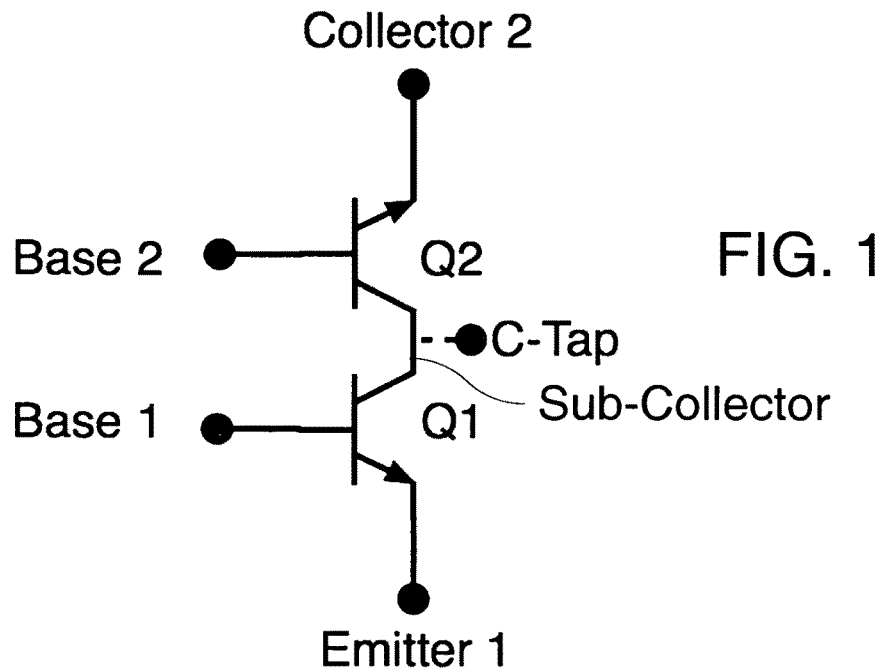
FIG. 1 is a schematic representation an inverse-mode cascode device.
Figure 2:
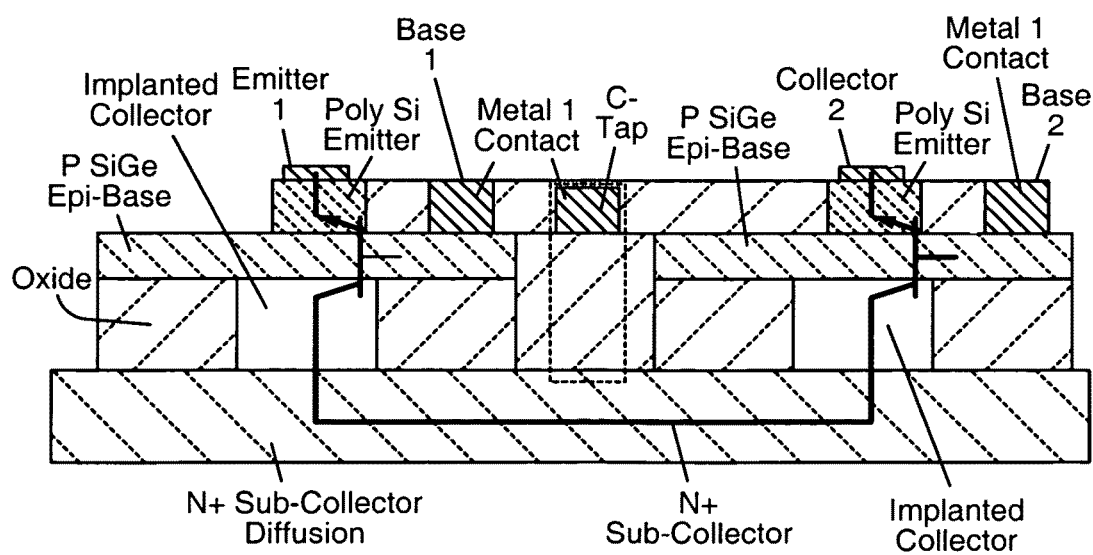
FIG. 2 is a cross-section of a representative inverse-mode cascode device.

Referring now in greater detail to the drawings, in which like numerals represent like components throughout the several views, FIGS. 1-3 illustrate preferred embodiments of the inverse-mode cascode device.

FIG. 1 is a schematic of an exemplary inverse-mode cascode device or structure. As shown in FIG. 1, a first transistor, Q1 is operated as a common-emitter amplifier. A second transistor, Q2, is operated in unity-current-gain common-base mode. Given sufficient headroom (two $V_{BE}$ drops at minimum), the device may be operated as a standard single device with an input signal applied to the base terminal, Base 1, of the first transistor, Q1, resulting in amplified current flow through Collector 2 of the second transistor, Q2. The first transistor, Q1, is operated in forward mode. Transistor Q2 is operated in inverse-mode. That is, transistor Q2 is connected such that its physical collector operates as an electrical emitter and its physical emitter operates as an electrical collector.

By operating, the inverse mode device in a common base configuration, and adding Q1, the performance of this pair is greatly improved over a single device operating in inverse mode. This device topology decouples the prominent output node of a current-mode logic digital device from the highly-sensitive subcollector-substrate junction, while maintaining standard device operation. An electrical connection to a shared sub-collector of the first and second transistors, Q1, Q2, referred to as a C-Tap, may be present. One benefit of this C-tap is to channel current away from the sub-collector during an SEU, thereby mitigating the effects of ionization strikes.

FIG. 2 is a cross-section of a representative embodiment of the device shown in FIG. 1. In the cascode topology, the physical collector of the first transistor, Q1, and physical collector of the second transistor, Q2, are connected via a sub-collector; therefore, an internal node can be formed by sharing the sub-collector of the two HBTs. This is accomplished through a simple modification of the HBT device layout and does not increase device dimensions, therefore no area penalty is taken for adding this second transistor. To form this device, the emitter-base pedestal layout from a "flattened" foundry layout is duplicated. The internal sub-collector contact may be used as the C-Tap node which aides in isolating the substrate from the output node. This electrical terminal swap provides decoupling of the output terminal and the sub-collector-substrate junction, promoting SEU mitigation.

The physical mask layout of this vertical structure comprises two pairs of n-p-n junctions connected via the lower n doping well. This well may or may not be isolated from the surrounding substrate. The first n-p-n junction is the first transistor, Q1, and the top-most n doping region is the emitter, the p type doping is the base, and the n type doping is shared between the physical collector of the first transistor, Q1, and the physical collector (electrical emitter) of the second transistor, Q2. The metal contact to this collector doping structure may or may not be included. The remaining doping layers represent the p type base of the second transistor, Q2, and n-type physical emitter (electrical collector) of the second transistor, Q2. It is understood by those skilled in the art that while this exemplary device is constructed as a n-p-n, the device may be constructed as a p-n-p device and such p-n-p devices are within the scope and creativity of the present invention.

FIG. 3a is an exemplary top-down representation of the device shown in FIG. 2. A layout comparison is shown between the exemplary device (FIG. 3a) and a standard SiGe HBT (FIG. 3b). Although the exemplary device effectively integrates two stand-alone transistors, no area penalty exists when comparing the enclosed deep trench area of an inverse cascode device with that of a single stand-alone SiGe HBT in a C-B-E-B-C layout. By optimizing the second transistor, Q2, for inverse-mode operation, the deep trench enclosed area is slightly increased; however the increase is minimal. The optimized inverse cascode device exhibits significantly improved values of $f_T$ compared to a standard inverse-mode device.

FIG. 4 shows Gummel characteristics, that plot base and collector current versus base voltage, for both a 0.12×2.5 μm² standard forward mode and an exemplary 0.12/0.5×2.5 μm² cascoded inverse SiGe HBT. The base-collector offset voltage (VCB) for both the first and second transistors, Q1, Q2, was maintained at 0 volts for this characterization. As shown in FIG. 4, the dc characteristics of the first transistor, Q1, in the cascoded inverse pair is not degraded due to the shared sub-collector. Therefore, there is a negligible performance impact of the layout modification to the exemplary device.

Figure 5:
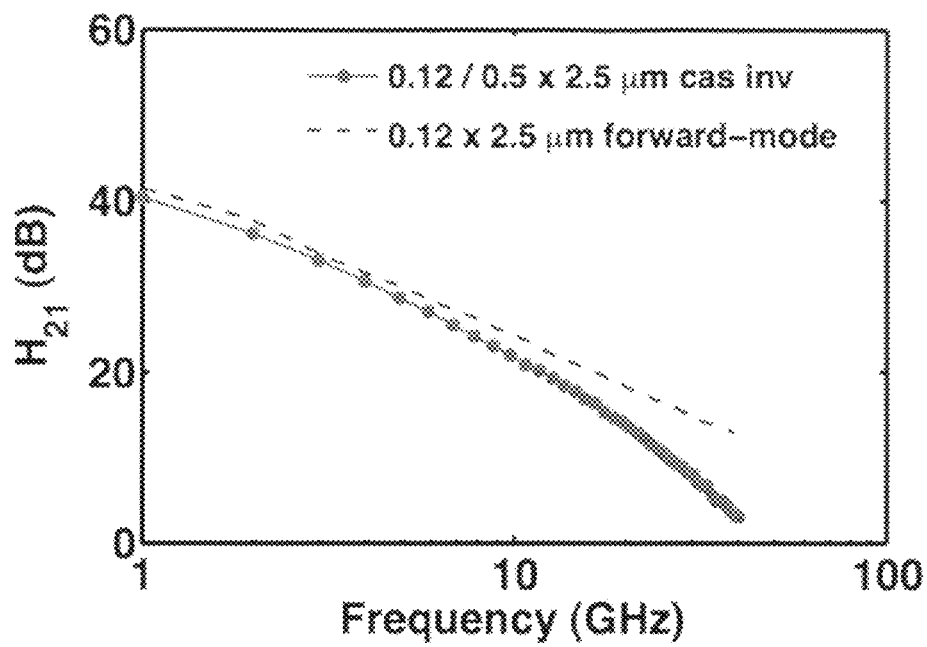
FIG. 5 is a plot of small signal current gain of a standard SiGe HBT and a representative inverse-mode cascode device.

Typically, in order to compare the high-frequency performance of standard SiGe HBTs, device level characterization is performed to extract the unity gain cutoff frequency ($f_T$) and maximum oscillation frequency ($f_{max}$). The parameter extraction methodology assumes a single-pole frequency response (20 dB/decade), which is valid for standard SiGe HBTs where the base-emitter ($C_{be}$) combined with the Miller capacitance (Cμ) dominate the frequency response. However, these cascoded inverse devices are comprised of two transistors and therefore have multiple lower-frequency poles. FIG. 5 highlights this multi-pole response which is shown by the increase decrease in slope of $H_{21}$ for the cascoded inverse device, while the response from the standard device maintains the 20 dB/decade slope.

Figure 6:
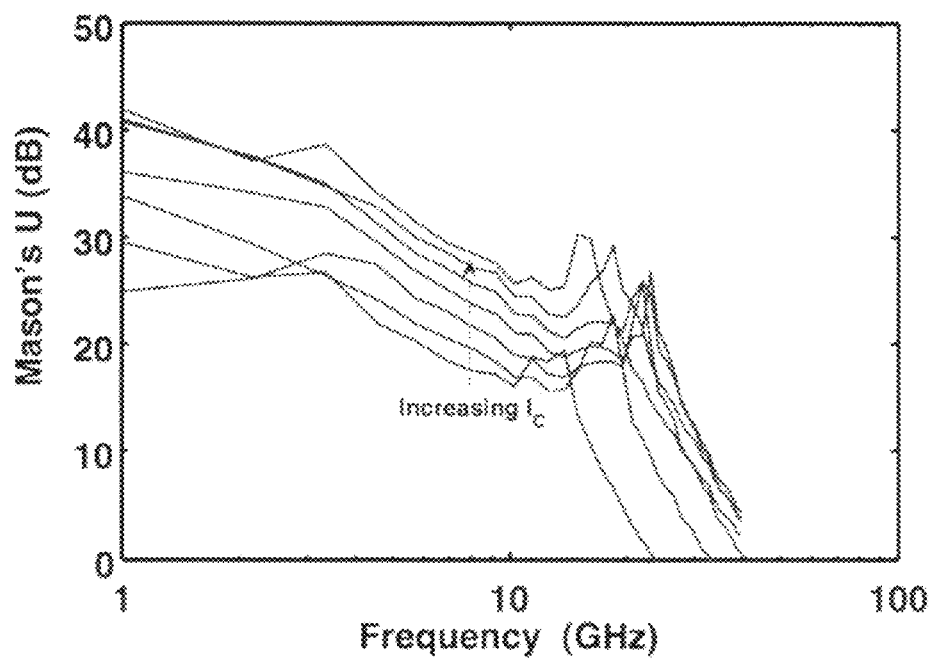
FIG. 6 is a plot of unilateral power gain for a representative inverse-mode cascode device.

FIG. 6 shows Mason's unilateral power gain (U) for this exemplary device. The exemplary device exhibits a gain peaking phenomenon at higher frequencies. As the collector current is increased, the peaking frequency shifts which is due to changes to the device capacitances as a function of bias. In addition to this peaking, U also exhibits a multi-pole response, with a large change in slope(60 dB/decade) after the peaking frequency, however, for frequencies below the peaking frequency, the slope is 20 dB/decade.

Figure 7:
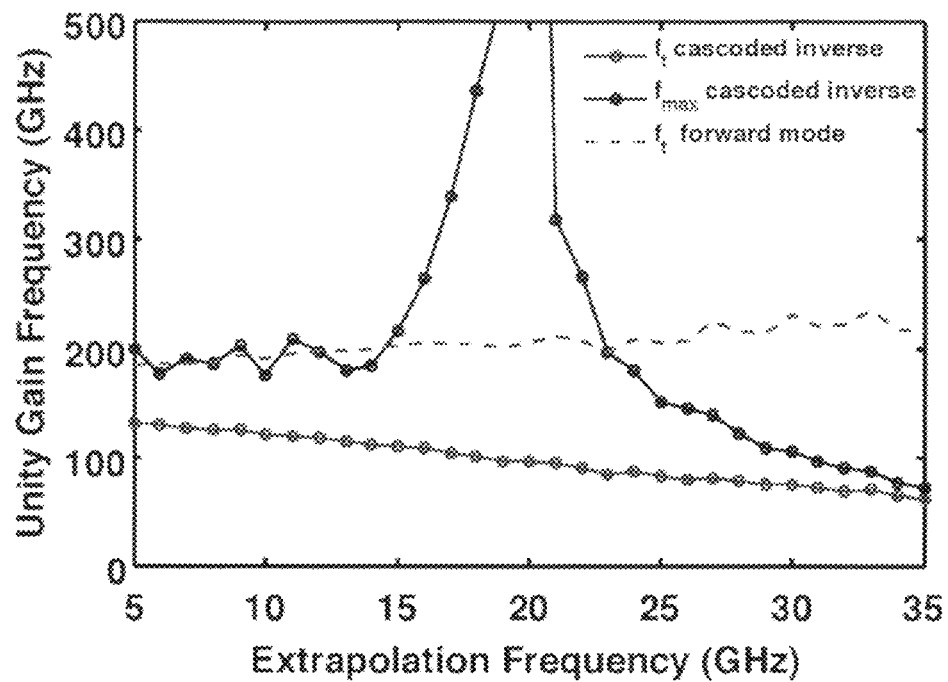
FIG. 7 is a plot of $f_T$ and fmax as a function of extraction frequency for a forward mode SiGe HBT and the inverse cascode device.

This performance over frequency can be best understood by examining FIG. 7. Here, $f_T$ and $f_{max}$ are plotted as a function of extraction frequency assuming a 20 dB/decade slope. For the standard device, $f_T$ varies only 10 percent over the extracted frequency range. However, for a cascoded inverse device, $f_T$ varies approximately 40 percent, and due to gain peaking, $f_{max}$ has a large dependence on extraction frequency. It is clear that below 15 GHz, the device power gain is comparable to a device with a 200 GHz $f_{max}$. The high-speed of these devices, even when using a much lower performance inverse-mode device, is attributed to the cascode architecture. Since the second transistor, Q2, is operating with unity current gain, its performance has little impact at low to moderate frequencies on the overall circuit gain.

Figure 8:
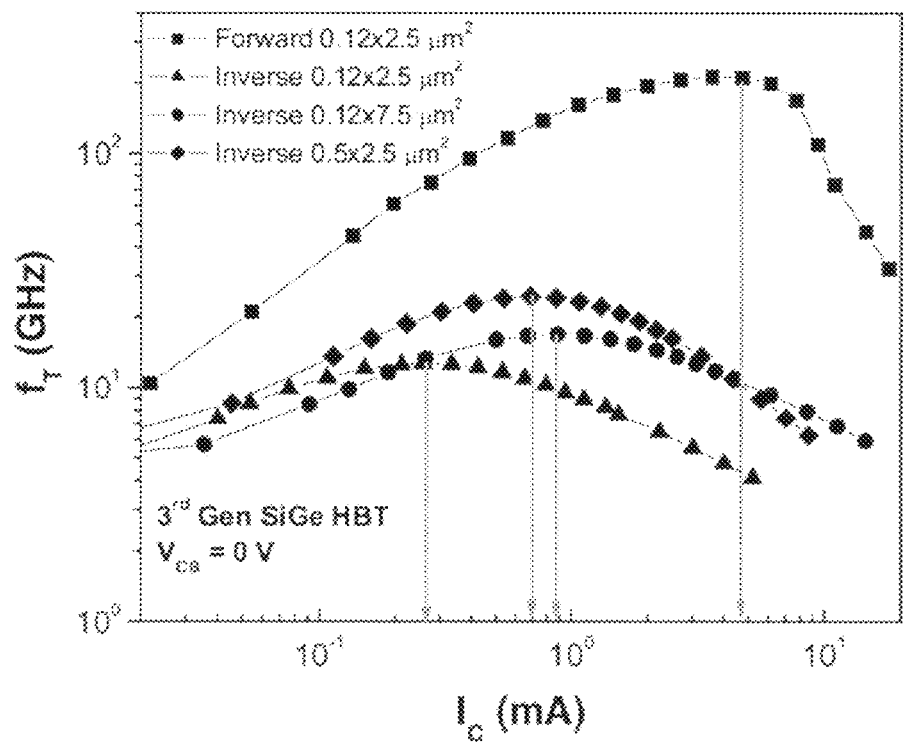
FIG. 8 is a plot of $f_T$ versus $I_c$ for forward-mode and inverse-mode SiGe HBTs.

In addition to the exemplary 0.12/0.12×2.5 μm² cascoded inverse device, an exemplary optimized 0.12/0.5×2.5 μm² was also characterized. This optimized device makes use of the difference in frequency response between the forward and inverse-mode devices. The difference in collector current density ($J_C$) at peak $f_T$ between the forward and inverse-mode operation is approximately 9 mA/μm². Therefore, by increasing the cascoded inverse device emitter width to 0.5 μm, the current through the cascode topology would be optimal for both devices and yield higher performance for these optimized devices. More particularly, the forward and inverse modes of operation have different peak cutoff frequencies ($f_T$) and also a different collector current at peak $f_T$. For example, as seen in FIG. 8, the collector current at peak $f_T$ for a 0.12×2.5 μm² device is about an order of magnitude higher in forward mode as compared to inverse mode. This difference in currents is due to a difference in the collector and emitter doping concentration and results in a decrease in inverse-mode peak cutoff frequency $f_T$ at a lower current density. To match the currents at peak $f_T$ therefore an inverse-mode operated device may have a larger geometry as compared to the forward-mode device. The larger geometry can be obtained by either increasing the length of the device (0.12×7.5 μm² in FIG. 8) or by increasing the width of the device (0.5×2.5 μm²). To optimize performance of a cascode configuration both the top device (second transistor, Q2) and bottom device (first transistor, Q1) should operate near their respective peak $f_T$. Given the difference in current densities, the geometry of the top device (second transistor, Q2) should be scaled such that both devices (transistors Q1, Q2) are operating in this optimal region. Therefore using a top inverse-mode device with a larger width or length as compared to the bottom forward mode operated device helps in optimizing the performance of the cascode structure. In the integrated inverse-mode cascode structure, only the width of the top device (second transistor, Q2) can be increased independent of the dimensions of the bottom device (first transistor, Q1).

Radiation Response

Figure 9:
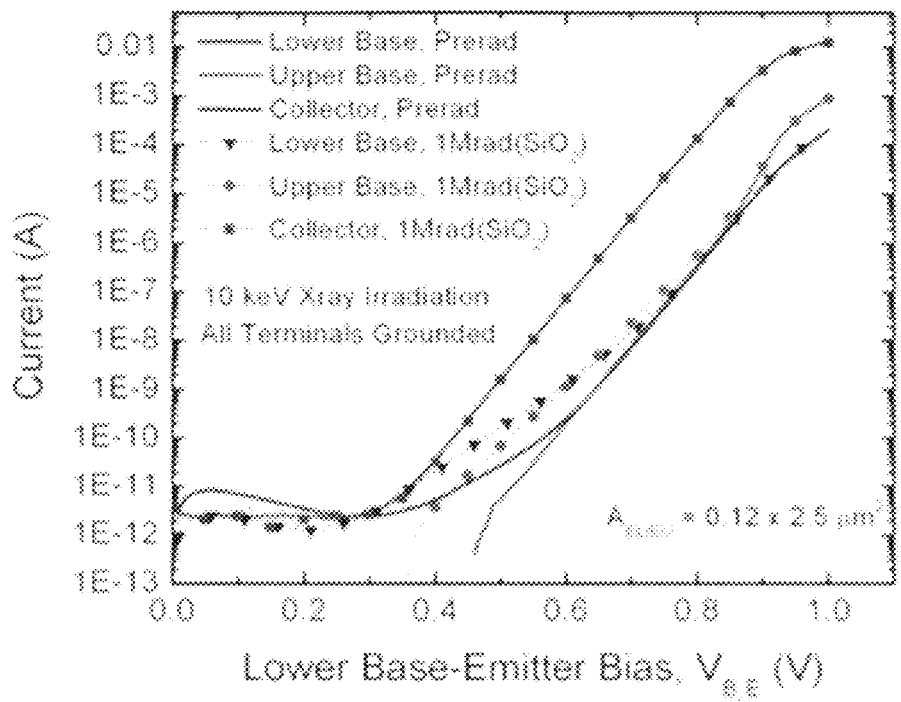
FIG. 9 is a plot of TID response of an exemplary inverse-mode cascode to 10 keV X-rays.
Figure 10:
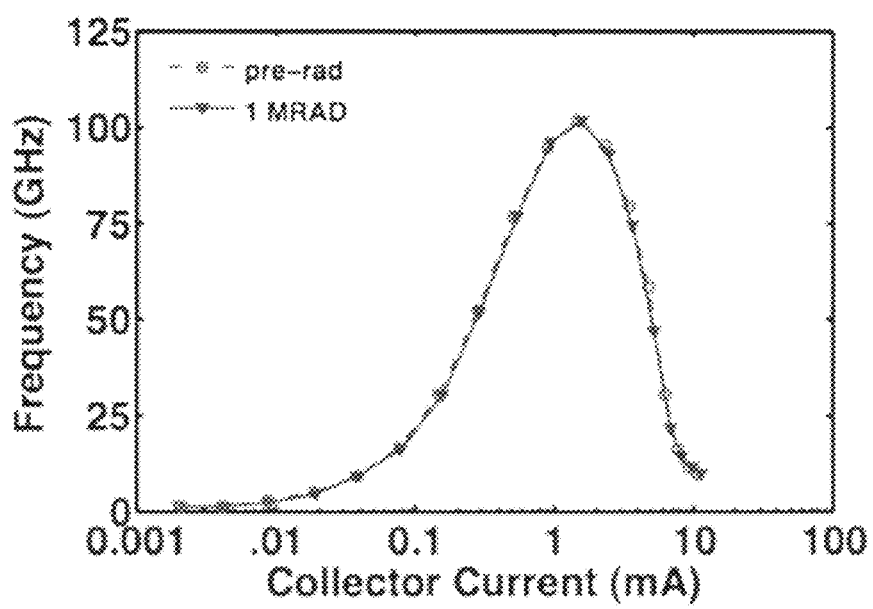
FIG. 10 is a plot of $f_T$ of pre and 1 MRAD post-radiated representative inverse-mode cascode extracted at 18 GHz.

The total dose radiation response and voltage limitations were also measured and characterized. Test structures were passively irradiated to a total dose of 1 MRAD. FIG. 9 shows little change in either the $I_{B1}$ or $I_{B2}$ post-radiation current, matching closely with standard device irradiation degradation. In addition, FIG. 10 compares the $f_T$ of an exemplary 0.12/0.5×2.5 µm² device (using an extraction frequency of 18 GHz) and also shows no post radiation degradation in performance. Therefore, the layout modifications of the exemplary inverse-mode device maintain for the circuit in aggregate the total dose radiation tolerance properties of the SiGe HBT.

For quantification of the SEU susceptibility of the exemplary inverse cascode structures, heavy ion microprobing was performed at Sandia National Laboratories' Nuclear Microprobe facility. Integrated ion beam induced charge collection (IBICC) was monitored on all terminals.

Figure 11:
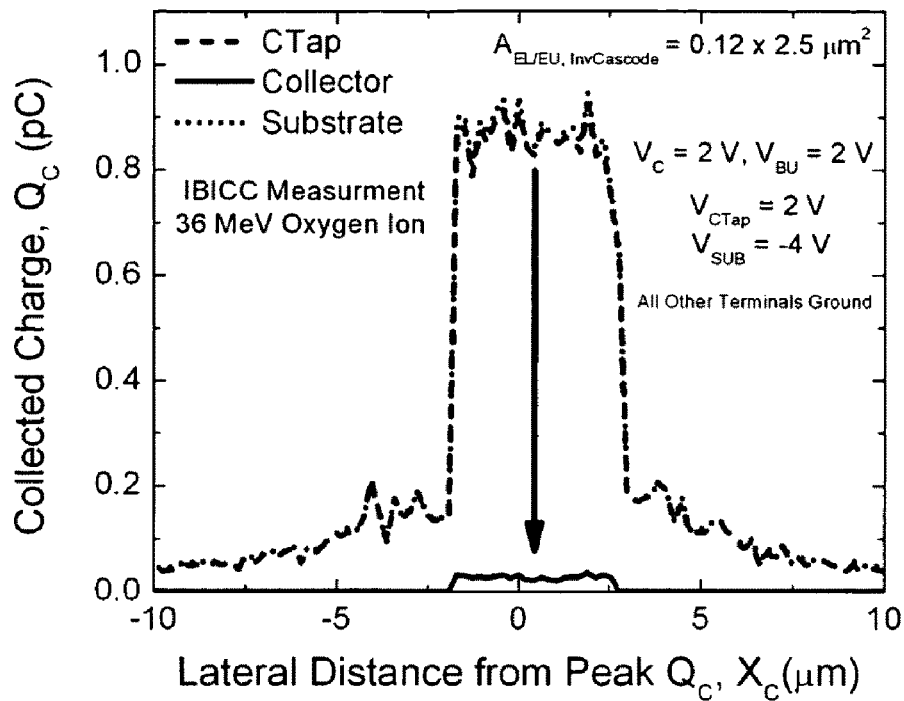
FIG. 11 is a plot of electrical collector-collected charge data.

FIG. 11 shows almost complete elimination of charge collection on the electrical collector terminal. The exemplary inverse cascode structure with the C-tap sub-collector reach-through contact shows vastly improved IBICC results; free electrons which are collected from the substrate-subcollector junction are quickly removed by the C-Tap contact. The only charges collected by the electrical collector are the ones initially deposited within the depletion regions of the active junctions of the device. Circuit topologies to leverage this RHBD technique include but are not limited to capacitors or p-MOSFETs tied to the C-Tap terminal.

Figure 12:
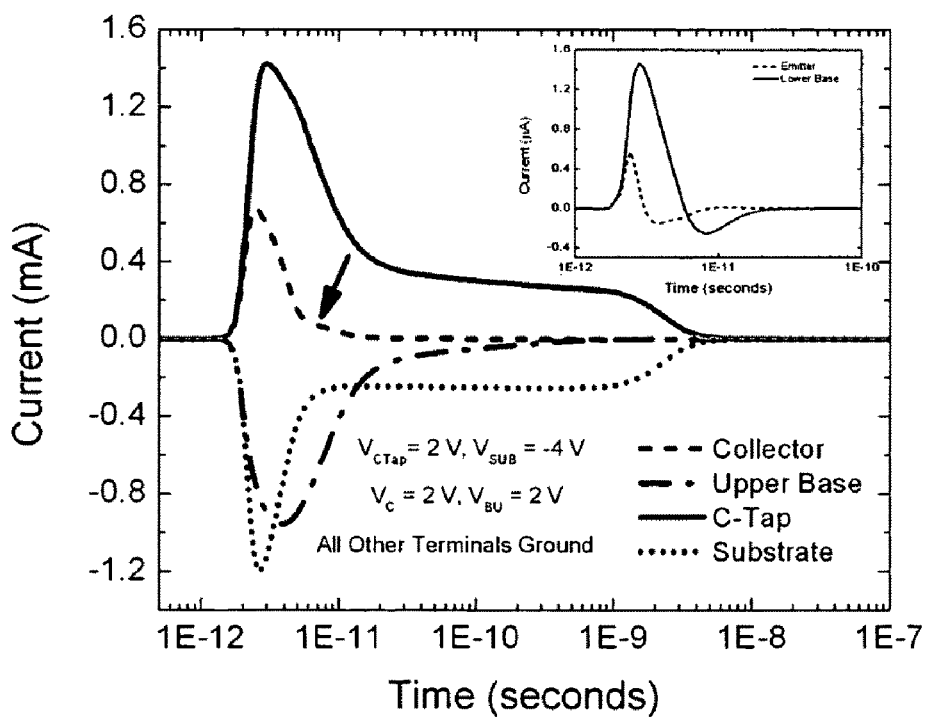
FIG. 12 is a plot of simulated current transients due to ion strikes.

To verify the experimental data that was obtained, and probe deeper into the underlying charge collection physics of the inverse cascode device, full three-dimensional ion strike simulations were performed using finite element modeling. All ion strike simulations utilized an ion LET of 5.4 MeV-cm²/mg. The strike location for all representative inverse cascode devices was chosen to be the center of the electrical collector, shown in FIG. 3. The simulated results show excellent agreement with measured heavy ion microprobe data. Ion strike simulations were also performed on the inverse cascode structure with the C-Tap terminal. The C-Tap terminal in conjunction with the isolation benefits of the device topology was found to completely dominate the charge collection profile, by removing all excess electrons which are swept into the sub-collector from the substrate (indicated by the large "diffusion tail") shown in FIG. 12. This leads to negligible charge induction on the electrical collector, the sensitive node for digital current-mode logic (CML).

Thus, a cascode circuit apparatus has been disclosed that comprises a common-emitter transistor, a common-base transistor, and a sub-collector providing electrical communication between the common-emitter collector and the common-base collector. The cascode circuit apparatus may utilize heterojunction bipolar transistors (HBTs). Additionally, the cascode circuit apparatus may utilize Silicon Germanium (SiGe) HBTs. Additionally, an optimized cascode circuit apparatus has been disclosed that comprises a common-emitter transistor; a common-base transistor that has a geometry configured to match peak currents of the common-emitter and common-base transistors.

The cascode circuit apparatus may further comprise an electrical conduit in electrical communication with the sub-collector. The cascode circuit apparatus with electrical conduit may utilize HBTs and those HBTs may be SiGe HBTs.

Methods have also been disclosed that provide for radiation hardening in a cascode circuit. An exemplary method comprises fabricating a cascode circuit having a common-emitter transistor, a common-base transistor, and a sub-collector; coupling a first end of the sub-collector to the common-emitter collector and coupling a second end of the sub-collector to the common-base collector such that the common-emitter collector, sub-collector, and common-base collector are in electrical communication. The exemplary method may additionally comprise fabricating the cascode circuit using HBTs and those HBTs may be SiGe HBTs. The exemplary method may also comprise fabricating an electrical conduit in electrical communication with the sub-collector. The exemplary method may additionally comprise fabricating the inverse-mode common-base transistor such that its geometry causes matching of peak currents of the common-emitter and common-base transistors.

While exemplary structures and methods have been particularly shown and described with respect to exemplary embodiments thereof, it should be understood by those skilled in the art that the foregoing and other changes in forms and details may be made without departing from the scope of the invention. It is therefore intended that the invention not be limited to the exact forms and details described and illustrated, but fall within the scope of the claims.

What is claimed is:

1. A cascode circuit apparatus comprising:
    a first transistor having emitter, base, and collector nodes;
    a second transistor having emitter, base, and collector nodes, wherein the second transistor is configured to operate in inverse mode;
    a common sub-collector extending and shared between the collectors of the first and the second transistors and providing electrical communication between the collectors of the first and the second transistors; and
    a c-tap node configured to dissipate charge from the cascode circuit resulting from a radiation event, the c-tap node being electrically coupled to the shared subcollector.

2. The apparatus recited in claim 1 wherein the transistors are heterojunction bipolar transistors.

3. The apparatus recited in claim 2 wherein the transistors are Silicon Germanium (SiGe) heterojunction bipolar transistors.

4. The apparatus recited in claim 1 wherein the transistors are bipolar junction transistors.

5. The apparatus recited in claim 4 wherein the transistors are heterojunction bipolar transistors.

6. The apparatus recited in claim 5 wherein the transistors are Silicon Germanium (SiGe) heterojunction bipolar transistors.

7. The apparatus recited in claim 1 further comprising an electrical conduit in electrical communication with the shared sub-collector.

8. The apparatus recited in claim 1 wherein the second transistor has a geometry configured to match optimum current density of both the first and second transistors.

9. The apparatus recited in claim 8, wherein at least one of a length or width of the second transistor is greater than a corresponding length or width of the first transistor.

10. A method for providing a cascode circuit, the method comprising:
    providing a cascode circuit comprising a first transistor having emitter, base, and collector nodes, a second transistor having emitter, base, and collector nodes, and a common sub-collector, wherein the second transistor is configured to operate in inverse mode;
    coupling the collector of the first transistor to the collector of the second transistor so that the common sub-collector is shared and extends physically between the collectors, and electrically couples the collectors so that the collectors are in electrical communication; and providing the cascode circuit with a c-tap node configured to dissipate charge from the cascode circuit resulting from a radiation event, the c-tap node being electrically coupled to the shared subcollector.

11. The method recited in claim 10 wherein providing the cascode circuit comprises providing the first and second transistors as heterojunction bipolar transistors.

12. The method recited in claim 11 wherein the cascode circuit is fabricated using a silicon germanium process.

13. The method recited in claim 10 wherein the cascode circuit further comprises fabricating an electrical conduit in electrical communication with the sub-collector.

14. The method recited in claim 13 wherein the cascode circuit comprises fabricating the cascode circuit using heterojunction bipolar transistors.

15. The method recited in claim 13 wherein the cascode circuit comprises fabricating the cascode circuit using a silicon germanium process.

16. The method recited in claim 10 wherein the cascode circuit comprises fabricating the cascode circuit using bipolar junction transistors.

17. The method of claim 10, further comprising operating the second transistor in an inverse-mode wherein the collector node is the emitter, and the emitter is the collector.

18. A method for providing a cascode circuit, the method comprising:
    providing a cascode circuit comprising a first transistor having emitter, base, and collector nodes, a second transistor having emitter, base, and collector nodes, and a common sub-collector, wherein the second transistor is configured to operate in inverse mode;
    coupling the collector of the first transistor to the collector of the second transistor so that the common sub-collector is shared and extends physically between the collectors, and electrically couples the collectors so that the collectors are in electrical communication; and
    providing the first transistor such that its geometry causes matching of peak currents of the second transistor; and
    providing the cascode circuit with a c-tap node configured to dissipate charge from the cascode circuit resulting from a radiation event, the c-tap node being electrically coupled to the shared subcollector.

19. The method of claim 18, wherein at least one of a length or width of the second transistor is greater than a corresponding length or width of the first transistor.

* * * * *